(12) United States Patent
Nishimura et al.

(10) Patent No.: US 6,522,872 B1
(45) Date of Patent: Feb. 18, 2003

(54) UP/DOWN TUNER

(75) Inventors: Tohru Nishimura, Osaka (JP); Masanori Kitaguchi, Habikino (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/179,968

(22) Filed: Oct. 28, 1998

(30) Foreign Application Priority Data

Nov. 27, 1997 (JP) ............................................. 9-326621

(51) Int. Cl.[7] ................................................ H04B 1/44
(52) U.S. Cl. ........................ 455/301; 455/315; 455/349
(58) Field of Search .................... 455/78, 106, 300, 455/301, 85, 86, 88, 128, 303, 315, 349

(56) References Cited

U.S. PATENT DOCUMENTS

| | | | | |
|---|---|---|---|---|
| 4,352,209 A | * | 9/1982 | Ma ............................... | 455/315 |
| 4,569,084 A | * | 2/1986 | Takahama ..................... | 455/131 |
| 4,661,998 A | * | 4/1987 | Yamashita et al. ........... | 455/315 |
| 4,843,637 A | * | 6/1989 | Shimura et al. .............. | 455/200 |
| 5,355,532 A | * | 10/1994 | Kubo et al. ................... | 455/301 |
| 5,438,690 A | * | 8/1995 | Tsukuda ....................... | 455/300 |
| 5,608,610 A | * | 3/1997 | Brzezinski .................... | 361/704 |
| 5,668,701 A | * | 9/1997 | Fukai ............................ | 361/816 |
| 5,880,403 A | * | 3/1999 | Cjazkowski et al. ......... | 174/35 R |

FOREIGN PATENT DOCUMENTS

| | | |
|---|---|---|
| JP | 61179846 | 11/1986 |
| JP | 06062331 | 3/1994 |
| JP | 9326621 | 8/2000 |

OTHER PUBLICATIONS

English Translation of Japanese Patent Office Notice of Rejection, dated Aug. 1. 2000.

* cited by examiner

*Primary Examiner*—Thanh Cong Le
*Assistant Examiner*—Thuan T. Nguyen
(74) *Attorney, Agent, or Firm*—Birch, Stewart, Kolasch & Birch, LLP

(57) ABSTRACT

An up-converter section and a down-converter section are contained in separate respective chassis. The up-converter section and the down-converter section are linked by an IF link section having a coaxial shielding structure. As such, a high-quality Up/Down tuner can be provided which is able to reduce the mutual influence of up-converter and down-converter local oscillator circuits and the entry of external noise, without increasing the size of the Up/Down tuner.

10 Claims, 18 Drawing Sheets

FIG.5 (a)
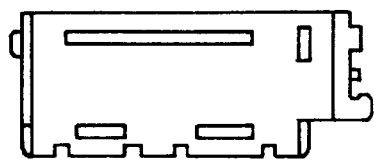
FIG.5(b)    FIG.5(c)    FIG.5(d)
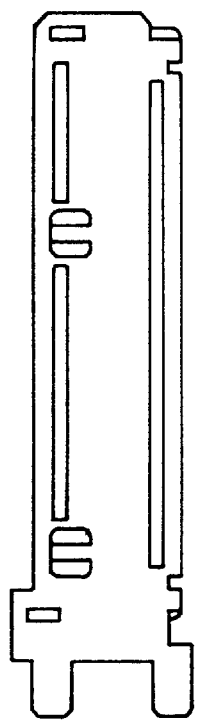 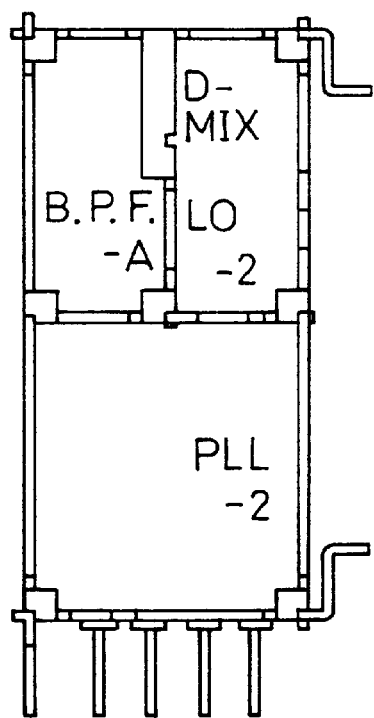 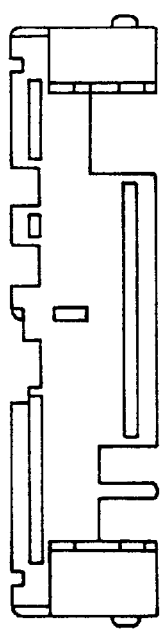
FIG.5(e)
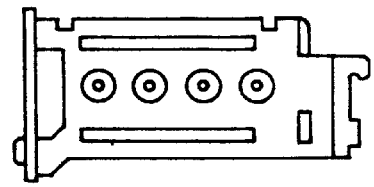

FIG. 10 (a)
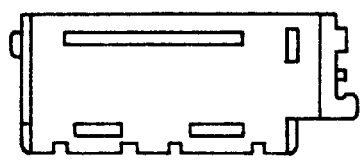
FIG.10(b)    FIG.10(c)    FIG.10(d)
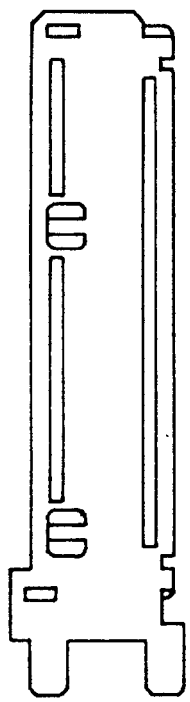 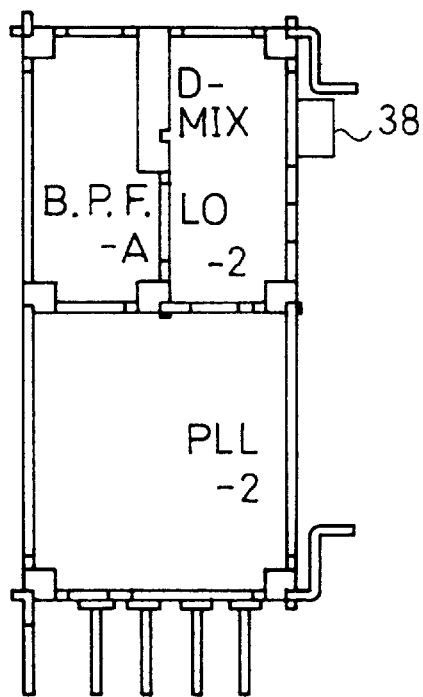 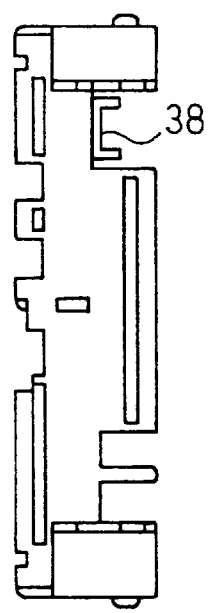
FIG.10(e)
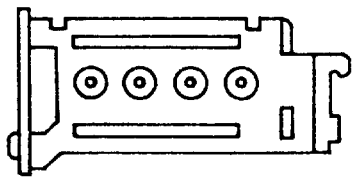

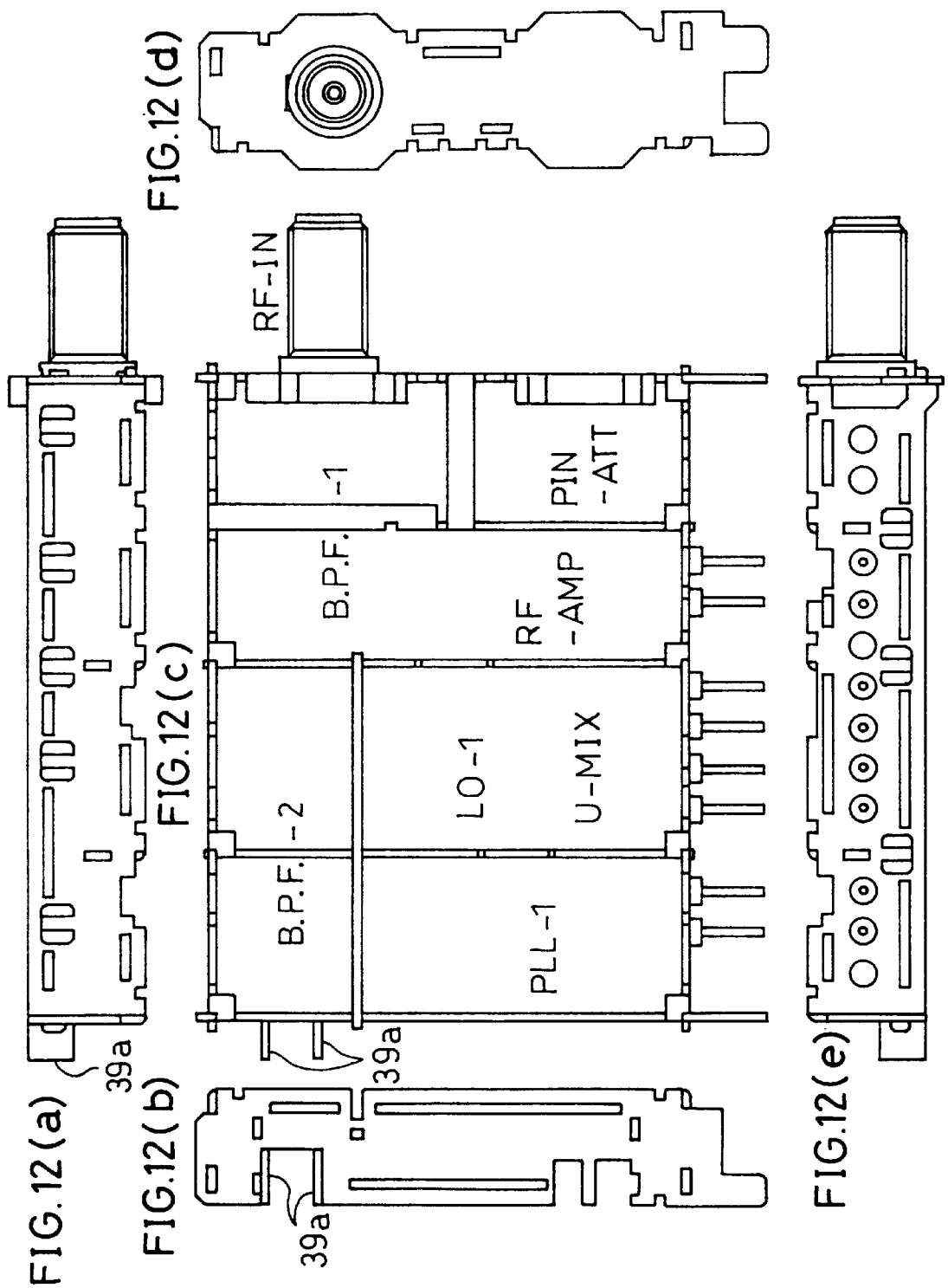

FIG.13(a)
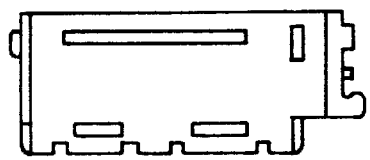
FIG.13(b)     FIG.13(c)     FIG.13(d)
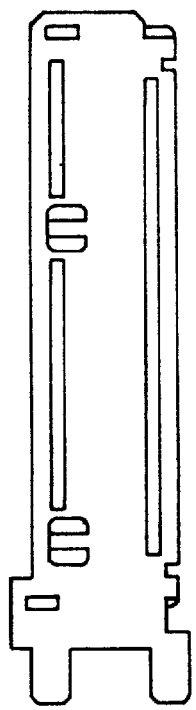 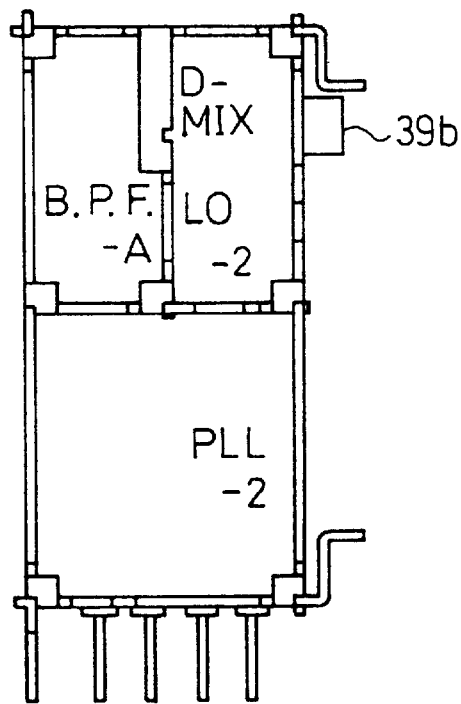 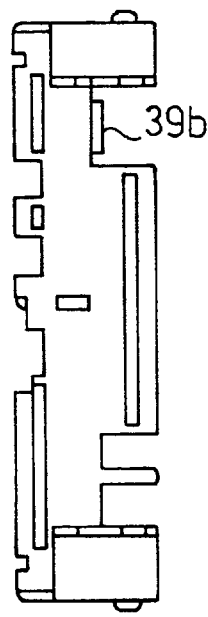
FIG.13(e)
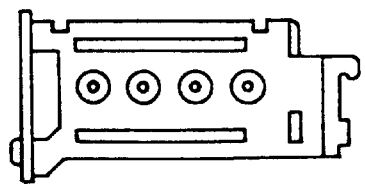

UP/DOWN TUNER

FIELD OF THE INVENTION

The present invention relates to a tuner for use in high-frequency circuit devices such as television receivers, videotape recorders, and personal computers, and in particular to an Up/Down tuner (double conversion tuner) for use in CATV (cable television) receivers.

BACKGROUND OF THE INVENTION

High-frequency circuit devices, such as television receivers, videotape recorders, and personal computers, vary in form according to the use to which they are put; among these, CATV (cable television) receivers use an Up/Down tuner. By first increasing the frequency of an inputted RF (radio frequency) signal in an up-converter, and then decreasing its frequency in a down-converter, an Up/Down tuner eliminates interference, etc. caused by contaminating external radio waves.

As shown in FIG. 17, a conventional Up/Down tuner is provided with an antenna terminal RF-IN, a first band-pass filter B.P.F.-1, a PIN attenuator PIN-ATT, an RF amplifier RF-AMP, an up-converter 50, a second band-pass filter B.P.F.-2, a down-converter 60, and an analog signal band-pass filter B.P.F.-A.

The up-converter 50 includes an up-converter mixing circuit U-MIX, a first PLL (Phase Locked Loop) 51, and a first local oscillator circuit LO-1, and the down-converter 60 includes a second PLL 61, a second local oscillator circuit LO-2, and a down-converter mixing circuit D-MIX.

A signal sent to the foregoing conventional Up/Down tuner is received by the antenna terminal RF-IN, and is sent through the first band-pass filter B.P.F.-1, the PIN attenuator PIN-ATT, and the RF amplifier RF-AMP, and inputted into the up-converter mixing circuit U-MIX.

The first PLL 51 controls the first local oscillator circuit LO-1 in accordance with the reception channel data, and inputs a first local oscillator signal into the up-converter mixing circuit U-MIX. In the up-converter mixing circuit U-MIX, the RF signal and the first local oscillator signal are mixed and converted into an IF (Intermediate Frequency) signal.

The foregoing IF signal is sent through the second band-pass filter B.P.F.-2 and inputted into the down-converter mixing circuit D-MIX of the down-converter 60.

The second PLL 61 controls the second local oscillator circuit LO-2 in accordance with the reception channel data, and inputs a second local oscillator signal into the down-converter mixing circuit D-MIX. In the down-converter mixing circuit D-MIX, the IF signal and the second local oscillator signal are mixed and converted into a second IF signal. The foregoing second IF signal is outputted through the analog signal band-pass filter B.P.F.-A.

Here, an automatic gain control (AGC) signal is inputted into the PIN attenuator PIN-ATT so that image contrast remains constant even if the strength of the received signal fluctuates.

FIGS. 18(a) through 18(e) are projection drawings of an Up/Down tuner with the foregoing structure, and FIG. 19 is a perspective drawing thereof. In the foregoing Up/Down tuner, as shown in FIGS. 18(a) through 18(e) and 19, in a single chassis, the foregoing members are divided from one another by partitions, which prevent interference due to noise produced by the respective blocks. Further, although not shown in FIGS. 18(a) through 18(e) and 19, upper and lower surfaces of the foregoing Up/Down tuner are provided with shield covers, which prevent the entry of external noise.

However, with the foregoing conventional structure, because of the existence of the first and second local oscillator signals, the IF signal, etc., and of high frequencies of n times these signals, it is insufficient merely to provide each of the foregoing blocks with partitions. In other words, in order to suppress spurious, cross-modulation, and other kinds of interference, which arise due to mutual influence of the foregoing frequencies, it is necessary to separate the first and second local oscillator signals from each other by as great a distance as possible. A problem with this is that it tends to increase the size of the Up/Down tuner.

Moreover, when the foregoing Up/Down tuner is used for digital applications, the wide band of the reception range makes the frequencies of the first and second local oscillator signals and the IF signal wide-band and high-frequency. In such a case, the higher the frequency of these signals, the more likely they are to travel, not only through the circuit, but also through the chassis. For this reason, there are limits to the effectiveness of merely separating the locations of the first and second local oscillator circuits, and it becomes difficult to suppress interference due to their mutual influence.

SUMMARY OF THE INVENTION

It is an object of the present invention to provide a high-quality Up/Down tuner which is able to reduce the mutual influence of up-converter and down-converter local oscillator circuits and the entry of external noise, without increasing the size of the Up/Down tuner.

In order to attain the foregoing object, an Up/Down tuner according to the present invention includes two or more frequency conversion sections contained in separate respective chassis, and a signal transmitting section linking the respective chassis containing the respective frequency conversion sections.

In the foregoing Up/Down tuner, each frequency conversion section is contained in a different respective chassis. For this reason, in comparison with a conventional Up/Down converter, in which a plurality of frequency conversion sections are contained in a single chassis, a signal produced by a local oscillator circuit in one frequency conversion section is less likely to travel through the chassis and influence the other frequency conversion section.

Further, in the Up/Down tuner according to the present invention, the signal transmitting section has a coaxial shielding structure, in which a grounded conductive material forms a shield surrounding a signal line which serves as the signal transmission path between the respective frequency conversion sections.

The foregoing structure can reduce unnecessary radiation, such as leakage of a signal from the local oscillator circuit, etc., of the frequency conversion section, as well as entry of external noise from the environment in which the tuner is placed.

Additional objects, features, and strengths of the present invention will be made clear by the description below. Further, the advantages of the present invention will be evident from the following explanation in reference to the drawings.

BRIEF DESCRIPTION OF THE DRAWINGS

FIGS. 5(a) through 5(e) show one example of a down-converter section included in the Up/Down tuner shown in FIG. 1, FIG. 5(c) being a plan view, FIG. 5(e) a front view, FIG. 5(a) a rear view, and FIGS. 5(b) and 5(d) side views.

FIGS. 10(a) through 10(e) show another example of a down-converter section included in the Up/Down tuner shown in FIG. 1, FIG. 10(c) being a plan view, FIG. 10(e) a front view, FIG. 10(a) a rear view, and FIGS. 10(b) and 10(d) side views.

FIGS. 12(a) through 12(e) show a further example of an up-converter section included in the Up/Down tuner shown in FIG. 1, FIG. 12(c) being a plan view, FIG. 12(e) a front view, FIG. 12(a) a rear view, and FIGS. 12(b) and 12(d) side views.

FIGS. 13(a) through 13(e) show a further example of a down-converter section included in the Up/Down tuner shown in FIG. 1, FIG. 13(c) being a plan view, FIG. 13(e) a front view, FIG. 13(a) a rear view, and FIGS. 13(b) and 13(d) side views.

DESCRIPTION OF THE EMBODIMENTS

The following will explain one embodiment of the present invention.

Figure 2:
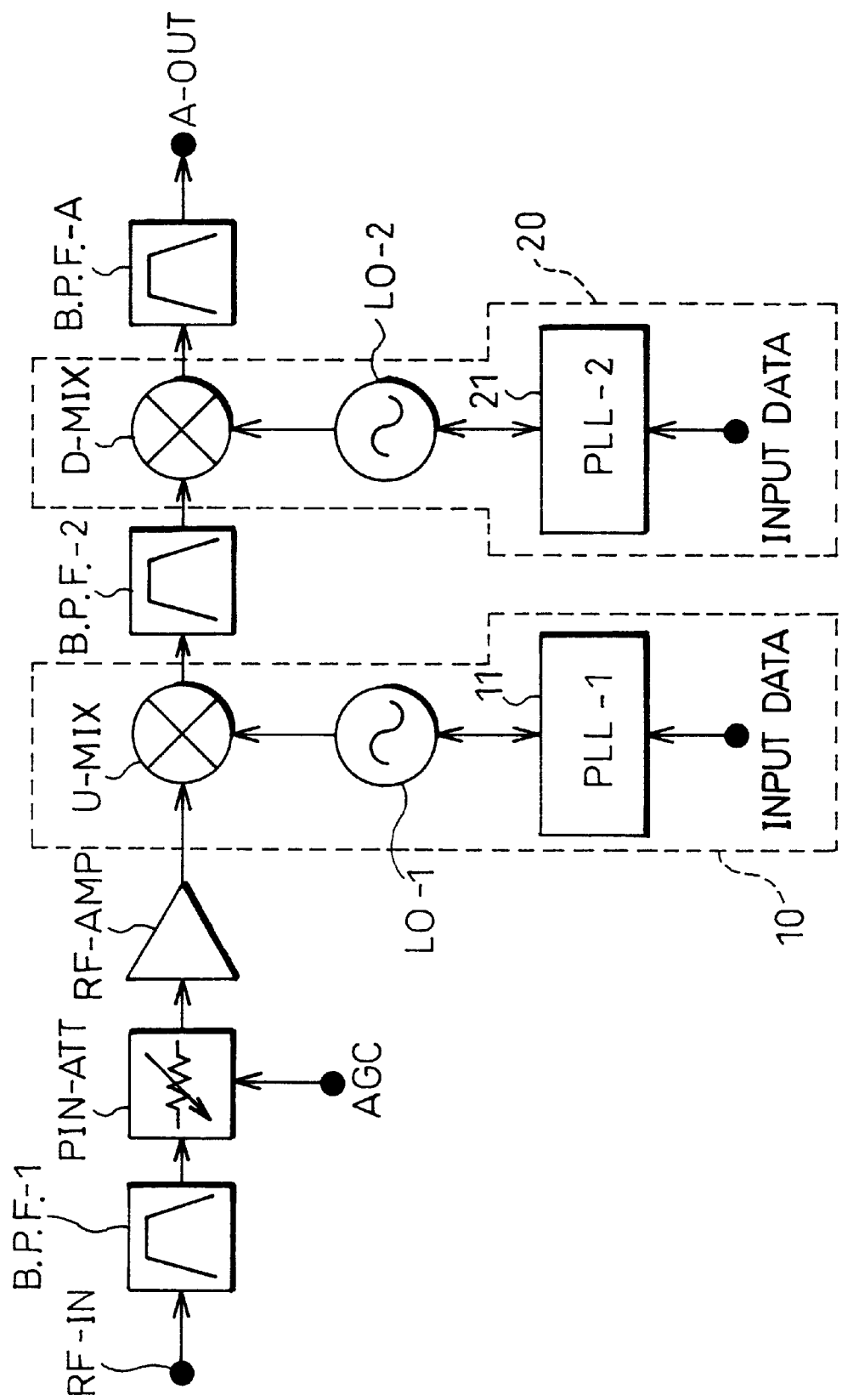
FIG. 2 is a block diagram showing the circuit structure of the foregoing Up/Down tuner.

As shown in FIG. 2, an Up/Down tuner according to the present embodiment is provided with an antenna terminal RF-IN, a first band-pass filter B.P.F.-1, a PIN attenuator PIN-ATT, an RF amplifier RF-AMP, an up-converter 10, a second band-pass filter B.P.F.-2, a down-converter 20, and an analog signal band-pass filter B.P.F.-A.

The up-converter 10 includes an up-converter mixing circuit U-MIX, a first PLL (Phase Locked Loop) 11, and a first local oscillator circuit LO-1, and the down-converter 20 includes a second PLL 21, a second local oscillator circuit LO-2, and a down-converter mixing circuit D-MIX.

The circuit structure and operations of the Up/Down tuner shown in FIG. 2 are the same as those of a conventional Up/Down tuner.

Figure 1:
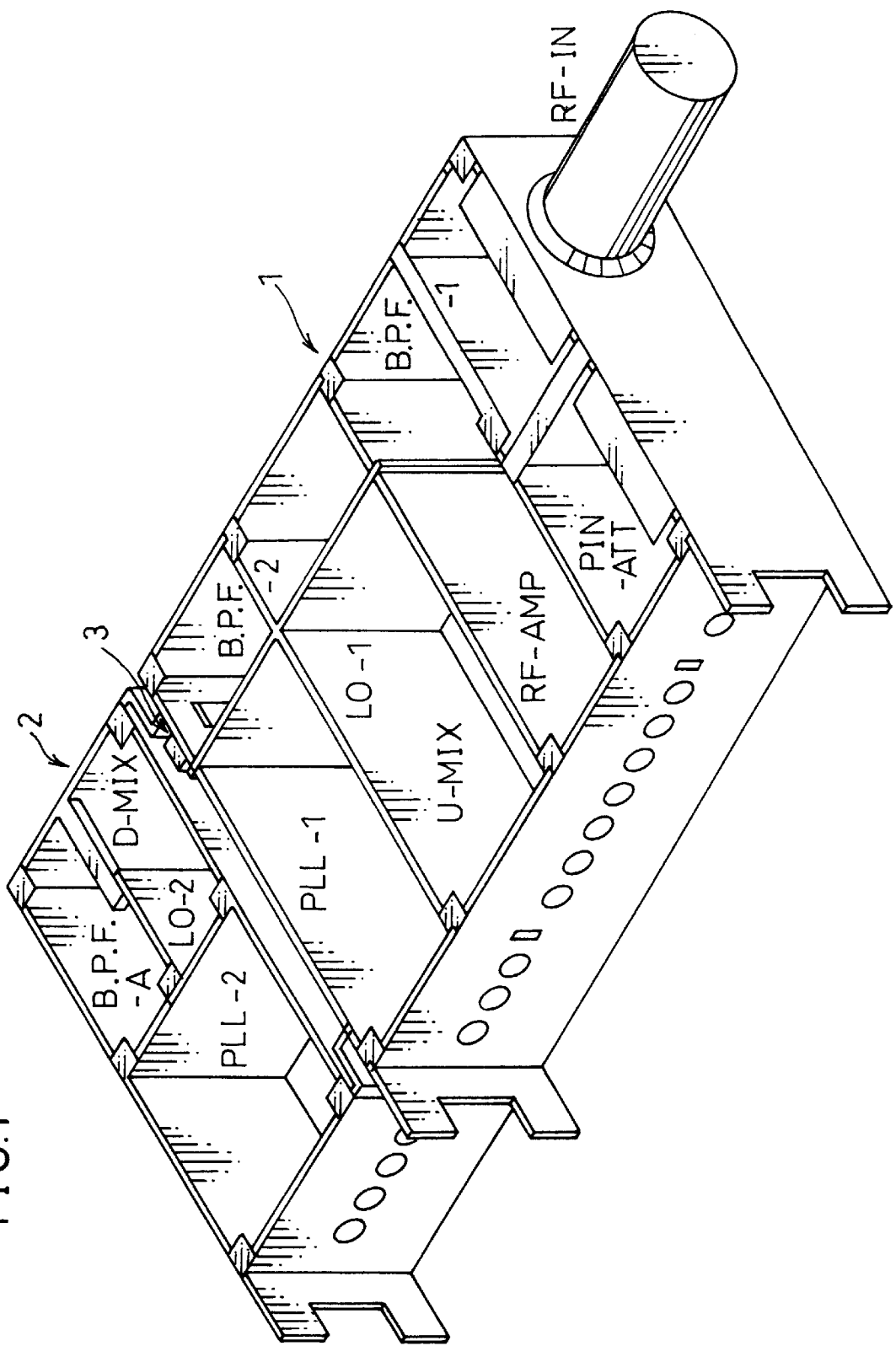
FIG. 1 is a perspective drawing schematically showing the structure of an Up/Down tuner according to one embodiment of the present invention.
Figure 3:
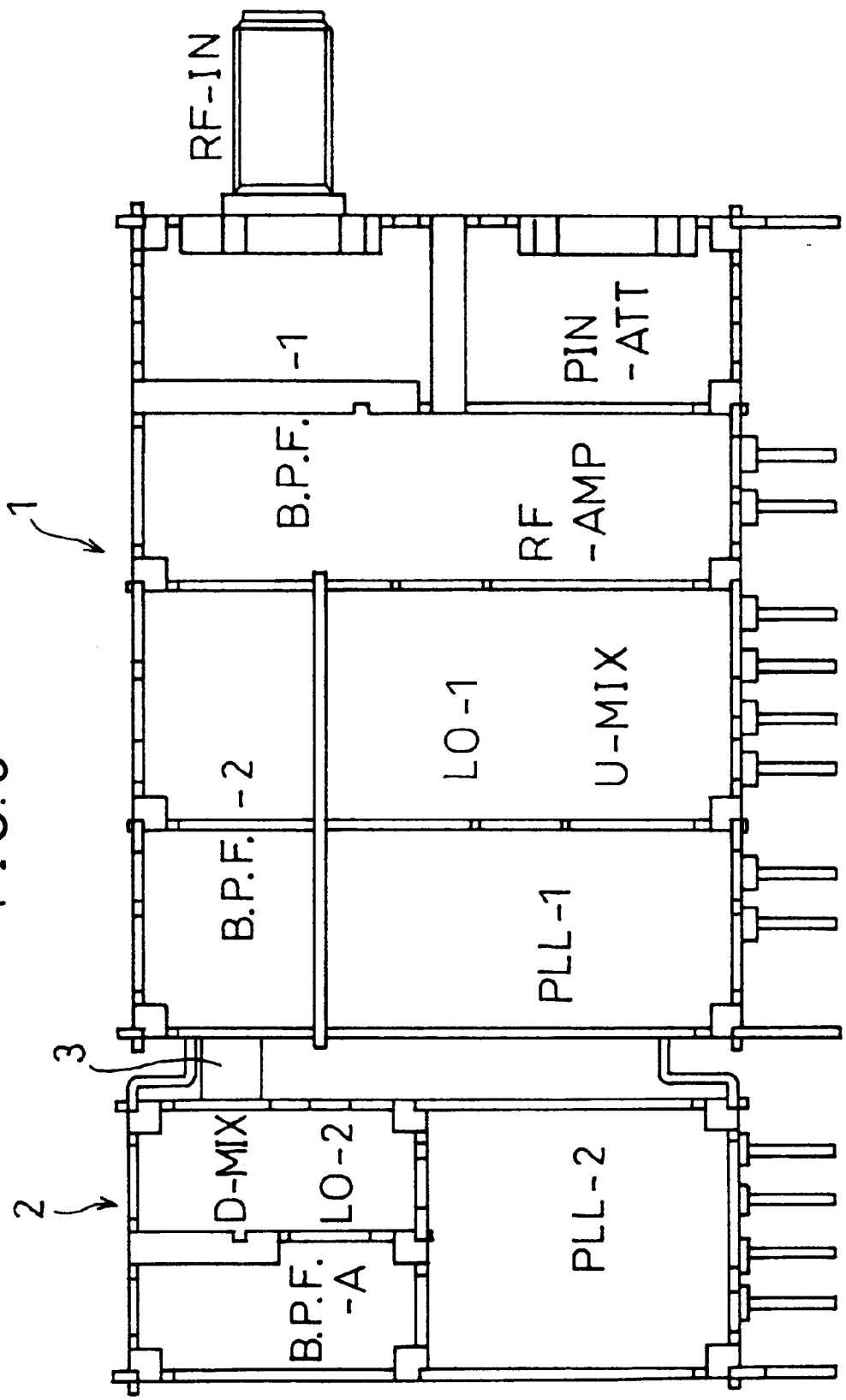
FIG. 3 is a plan view of the Up/Down tuner shown in FIG. 1.
Figure 4:
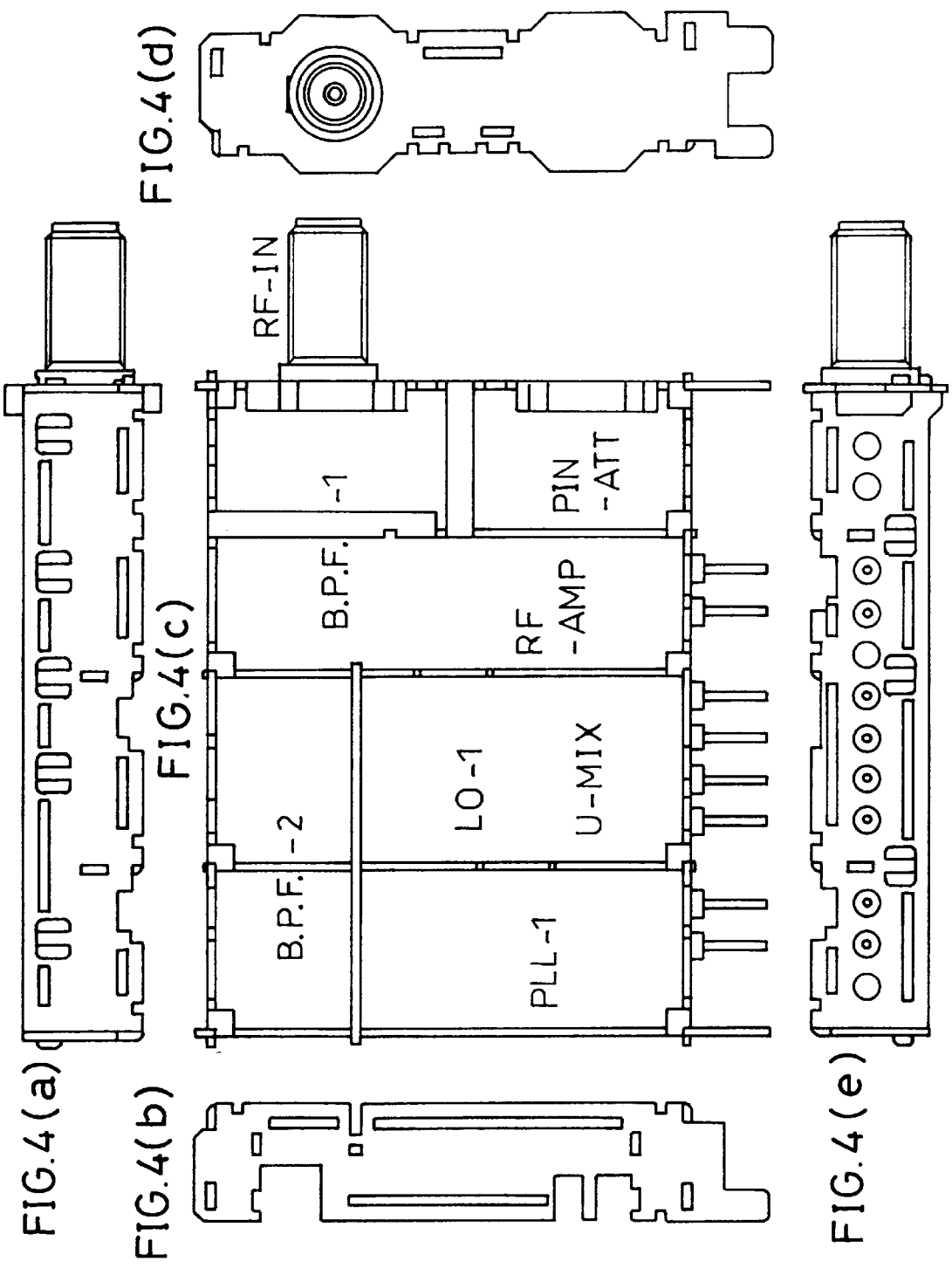
FIGS. 4(a) through 4(e) show one example of an up-converter section included in the Up/Down tuner shown in FIG. 1, FIG. 4(c) being a plan view, FIG. 4(e) a front view, FIG. 4(a) a rear view, and FIGS. 4(b) and 4(d) side views.

However, in the Up/Down tuner according to the present embodiment, as shown in FIGS. 1 and 3, an up-converter section 1 which includes the up-converter 10 and a down-converter section 2 which contains the down-converter 20 are contained in separate chassis, and the up-converter section 1 and the down-converter section 2 are linked by an IF link section 3.

The up-converter section 1 and the down-converter section 2 correspond to the frequency conversion sections and the IF link section 3 corresponds to a signal transmitting device. The present embodiment explains an example in which two frequency conversion sections are provided, but the present invention may alternatively include three or more frequency conversion sections. In such a case, each frequency conversion section is contained in a separate chassis.

As shown in FIGS. 4(a) through 4(e), the up-converter section 1, in addition to the up-converter 10, includes the antenna terminal RF-IN, the first band-pass filter B.P.F.-1, the PIN attenuator PIN-ATT, the RF amplifier RF-AMP, and the second band-pass filter B.P.F.-2. The foregoing members are divided into separate blocks in order to prevent mutual influence due to signal leakage, etc.

Further, as shown in FIGS. 5(a) through 5(e), the down-converter section 2, in addition to the down-converter 20, includes the analog signal band-pass filter B.P.F.-A. The foregoing members are divided into separate blocks in order to prevent mutual influence due to signal leakage, etc.

Incidentally, in the present invention, the up-converter section 1 and the down-converter section 2 are not limited to the foregoing structure; any structure is satisfactory provided the up-converter section 1 includes the up-converter 10, and the down-converter section 2 includes the down-converter 20. For example, the second band-pass filter B.P.F.-2, which, in the circuit structure, is provided between the up-converter 10 and the down-converter 20, may be included in the down-converter section 2.

Further, although not shown in FIGS. 1, 3, 4(a) through 4(e), and 5(a) through 5(e), upper and lower surfaces of the up-converter section 1 and the down-converter section 2 are shielded by shield covers, which prevent the entry of external noise. Further, the chassis and shield covers of the up-converter section 1 and the down-converter section 2 are made of conductive material, and are grounded.

Next, the IF link section 3, which connects the up-converter section 1 and the down-converter section 2, will be explained in detail.

Figure 6:
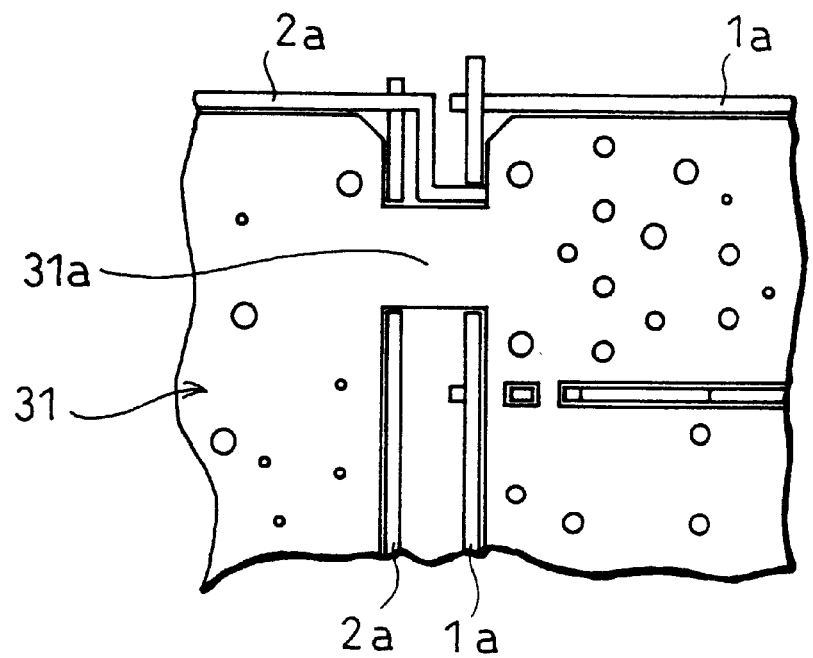
FIG. 6 is an explanatory drawing showing one example of a structure for an IF link section of the Up/Down tuner shown in FIG. 1.
Figure 7:
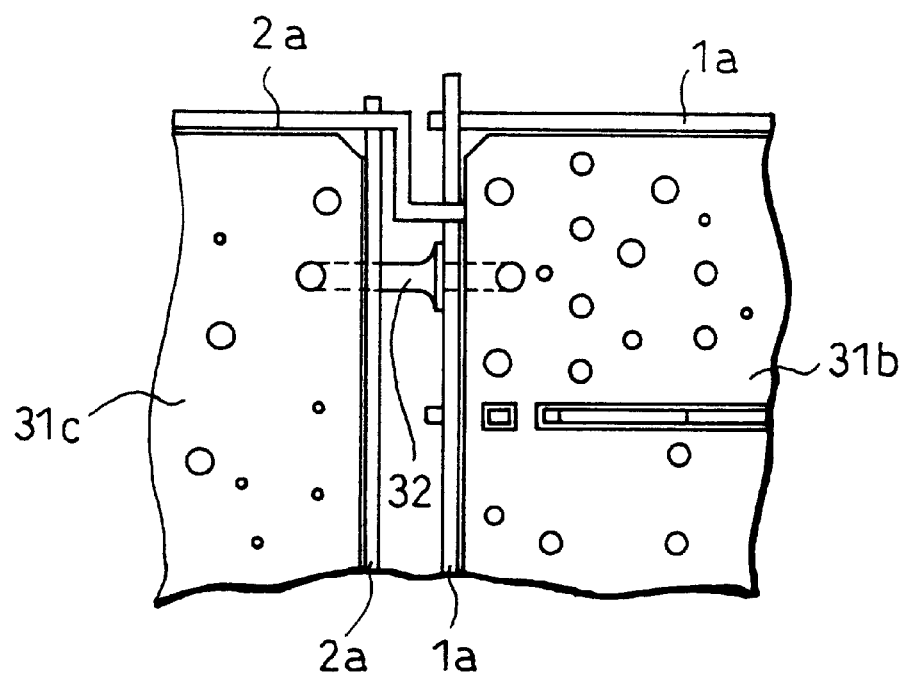
FIG. 7 is an explanatory drawing showing another example of a structure for an IF link section of the Up/Down tuner shown in FIG. 1.

The IF link section 3 serves to transmit the IF signal between the up-converter section 1 and the down-converter section 2. FIGS. 6 and 7 show two examples of structures for the IF link section 3. In FIG. 6, a completed substrate 31, on which are mounted the members making up the tuner circuit, is affixed to a chassis 1a, provided so as to surround the up-converter section 1. It is also affixed to a chassis 2a, provided so as to surround the down-converter section 2. The IF link section 3 is formed by shielding a bridge section 31a, which is part of the completed substrate 31. The shielding structure of the bridge section 31a is not shown in FIG. 6, but will be explained in detail later.

In FIG. 7, on the other hand, the completed substrate 31 is divided into an up-converter substrate 31b in the up-converter section 1, and a down-converter substrate 31c in the down-converter section 2, and the up-converter section 1 and the down-converter section 2 are connected by a terminal 32 having a coaxial shielding structure, made of a through-type capacitor, a lead frame, etc. In the structure in FIG. 7, the terminal 32 forms the IF link section 3.

Next, Examples 1 through 5 below will explain specific examples of shielding structures in an IF link section 3 which is formed of a shielded substrate. Incidentally, the substrate used in the present invention may be either a single-sided or a double-sided substrate. However, when using a single-sided substrate, a structure for shielding all the way around the substrate becomes necessary, but when using a double-sided substrate, the structure of the IF link section 3 can be simplified by providing the signal line on one surface of the substrate, and using the other surface as a shield surface. In other words, use of a double-sided substrate is preferable because, a lower shield being unnecessary, the number of members can be reduced and the manufacturing process can be streamlined, thus contributing to reduction of costs. Accordingly, Examples 1 through 4 below explain case in which a double-sided substrate is used to form the IF link section 3. Further, Example 5 explains a case in which a multi-layered substrate is used to form the IF link section 3.

EXAMPLE 1

First, the structure of the Up/Down tuner according to the present Example 1 will be explained.

The present Up/Down tuner is made up of the up-converter section 1 shown in FIGS. 4(a) through 4(e), combined with the down-converter 2 shown in FIGS. 5(a) through 5(e). In this case, the IF link section 3 is formed, as shown in FIG. 6, of the bridge section 31a of a single-plate completed substrate 31 which is shared by the up-converter section 1 and the down-converter section 2.

Figure 8:
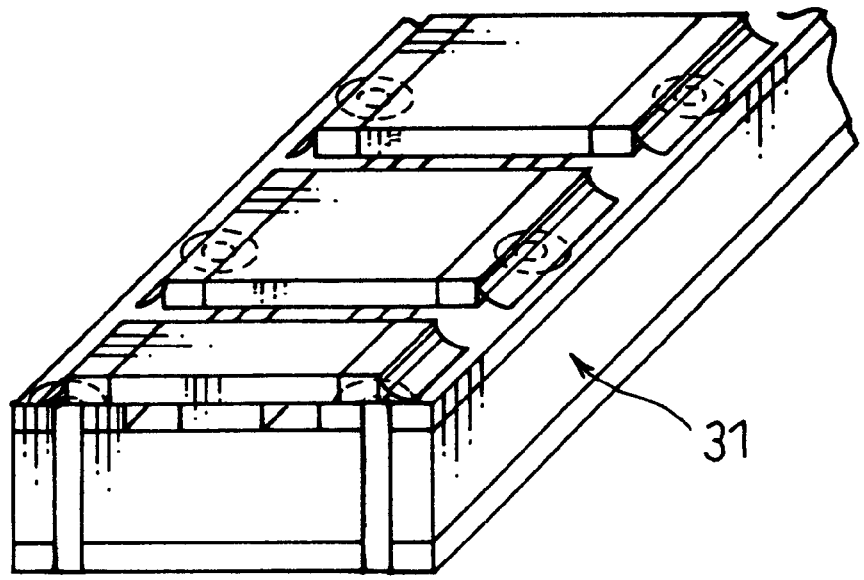
FIG. 8(a) is a perspective view showing one example of a structure for an IF link section of the Up/Down tuner shown in FIG. 1.
FIG. 8(b) is a cross-sectional view of the foregoing IF link section.
Figure 8:
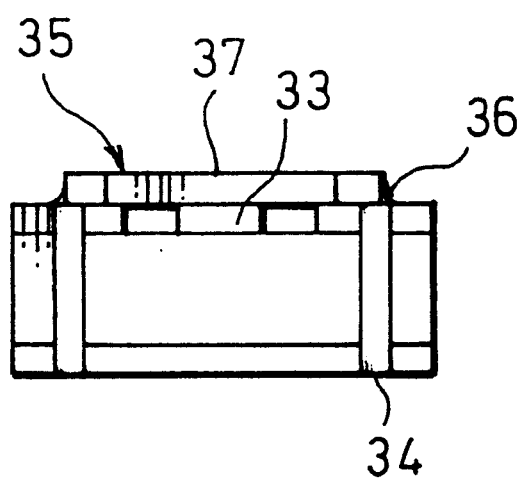
Figure 9:
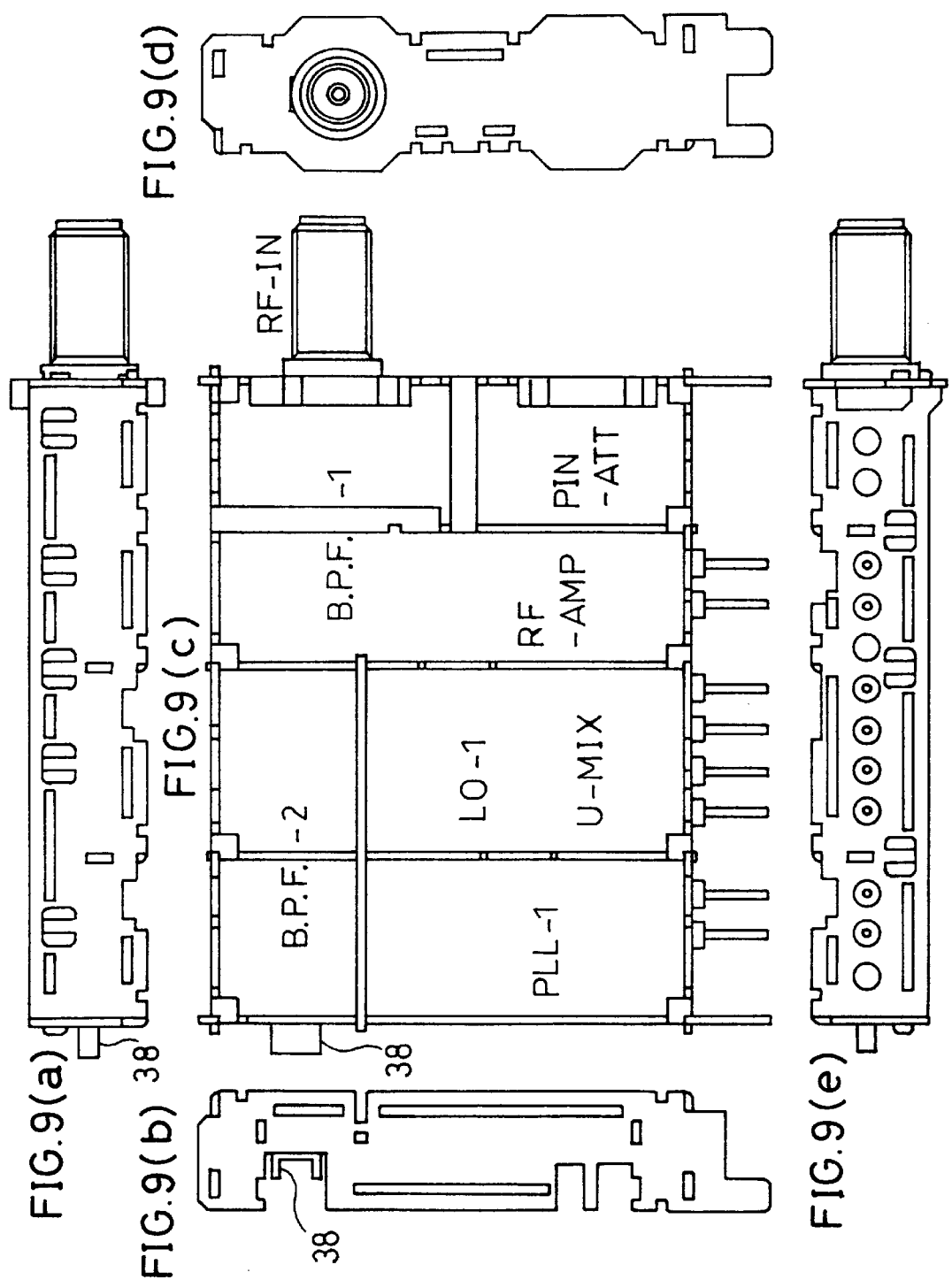
FIGS. 9(a) through 9(e) show another example of an up-converter section included in the Up/Down tuner shown in FIG. 1, FIG. 9(c) being a plan view, FIG. 9(e) a front view, FIG. 9(a) a rear view, and FIGS. 9(b) and 9(d) side views.

As shown in FIGS. 8(a) and 8(b), a double-sided substrate is used for the completed substrate 31. On one surface of the completed substrate 31 are provided three conductive lines, the middle line being used as a signal line 33, which transmits the IF signal from the up-converter section 1 to the down-converter section 2. The lines on either side of the signal line 33 are electrically connected, by through holes 34 filled with a conductive material, to a conductive surface on the opposite surface of the completed substrate 31. In what follows, the surface of the completed substrate 31 provided with the signal line 33 will be referred to as the "front," and the opposite surface thereof will be referred to as the "back."

Further, on the front of the completed substrate 31, a chip jumper 35 or other shield member such as a flat plate, etc., is attached by solder 36 to the lines on either side of the signal line 33. The chip jumper 35 is made up of a ceramic substrate, on the exterior of which is formed a conductive film which serves as the electrode, and on the exterior of the conductive film is formed a protective film 37. By means of the chip jumper 35, the lines on either side of the signal line 33 are electrically connected.

Incidentally, even when the shield member used is a flat plate instead of the chip jumper 35, since there is a resist on the upper surface of the signal line 33, no short circuit occurs between the shield member and the signal line 33 even if these members come into contact.

In the IF link section 3 with the foregoing structure, the signal line 33 is surrounded and insulated on all sides by the conductive surface on the back of the completed substrate 31, the through holes 34, the solder 36, and the chip jumper 35. Here, by grounding, for example, the conductive surface on the back of the completed substrate 31, the IF link section 3 can be given a coaxial shielding structure, in which the signal line 33 is surrounded on all sides by ground.

Giving the IF link section 3 a coaxial shielding structure in this way can greatly reduce entry into the tuner of external noise from the environment in which the tuner is placed.

EXAMPLE 2

First, the structure of the Up/Down tuner according to the present Example 2 will be explained.

In the present Up/Down tuner, part of the chassis of the up-converter section 1 or of the down-converter section 2 forms part of the shield of the signal line 33 of the IF link section 3. In other words, when the Up/Down tuner is made up of the up-converter section 1 shown in FIGS. 9(a) through 9(e) combined with the down-converter 2 shown in FIGS. 5(a) through 5(e), a shield section 38, which is part of the chassis of the up-converter section 1, shields the line 33 of the IF link section 3.

Again, when the Up/Down tuner is made up of the up-converter section 1 shown in FIGS. 4(a) through 4(e) combined with the down-converter 2 shown in FIGS. 10(a) through 10(e), a shield section 38, which is part of the chassis of the down-converter section 2, shields the line 33 of the IF link section 3.

Figure 11A:
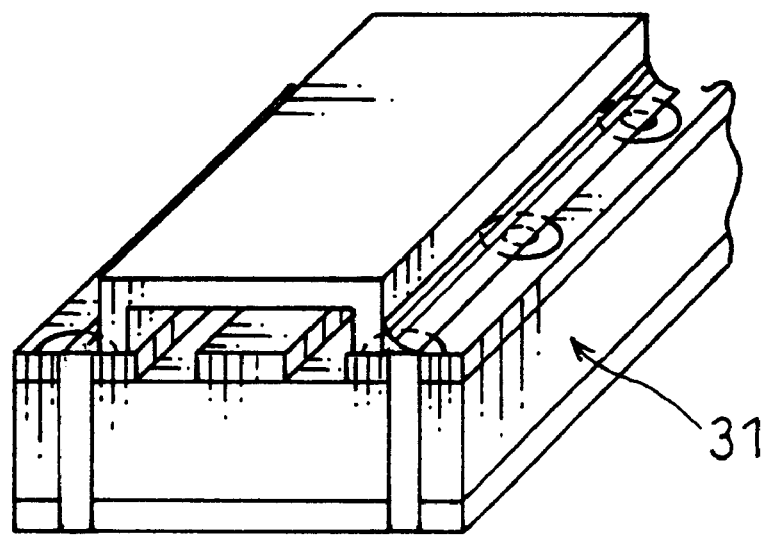
FIGS. 11(a) and 11(b) show a further example of a structure for an IF link section of the Up/Down tuner shown in FIG. 1, FIG. 11(a) being a perspective view and FIG. 11(b), a cross-sectional view.
Figure 11B:
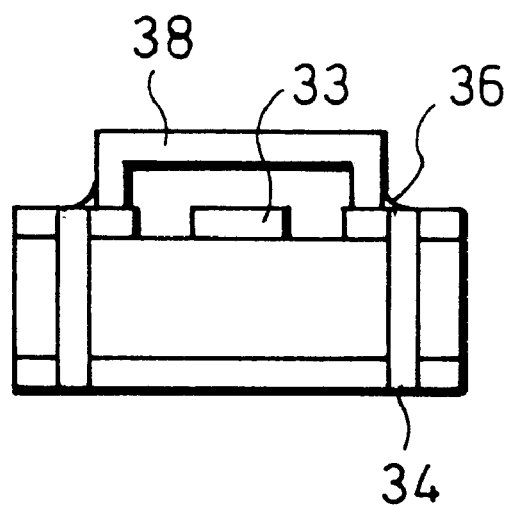

In either case, in the IF link section 3, as shown in FIGS. 11(a) and 11(b), the structure on the completed substrate 31 is the same as in Example 1, but the front of the completed substrate 31 is shielded by the shield section 38 instead of the chip jumper 35.

In cross-section, the shield section 38 is shaped like a rectangle open on one side, and covers the signal line 33 without touching it. In this way, the front of the completed substrate 31 is shielded. The sides of the shield section 38 are electrically connected, by the solder 36, to the lines on either side of the signal line 33.

Accordingly, in the IF link section 3 with the foregoing structure, the signal line 33 is surrounded and insulated on all sides by the conductive surface on the back of the completed substrate 31, the through holes 34, the solder 36, and the shield section 38. Here, by grounding, for example, the conductive surface on the back of the completed substrate 31, the IF link section 3 can be given a coaxial shielding structure, in which the signal line 33 is surrounded on all sides by ground.

Giving the IF link section 3 a coaxial shielding structure in this way can greatly reduce entry into the tuner of external noise from the environment in which the tuner is placed.

EXAMPLE 3

First, the structure of the Up/Down tuner according to the present Example 3 will be explained.

In the present Up/Down tuner, part of the shield of the signal line 33 of the IF link section 3 is formed by part of the chassis of the up-converter section 1 and part of the chassis of the down-converter section 2. In other words, the Up/Down tuner according to the present Example is made up of the up-converter section 1 shown in FIGS. 12(a) through 12(e), combined with the down-converter 2 shown in FIGS. 13(a) through 13(e).

Figure 14:
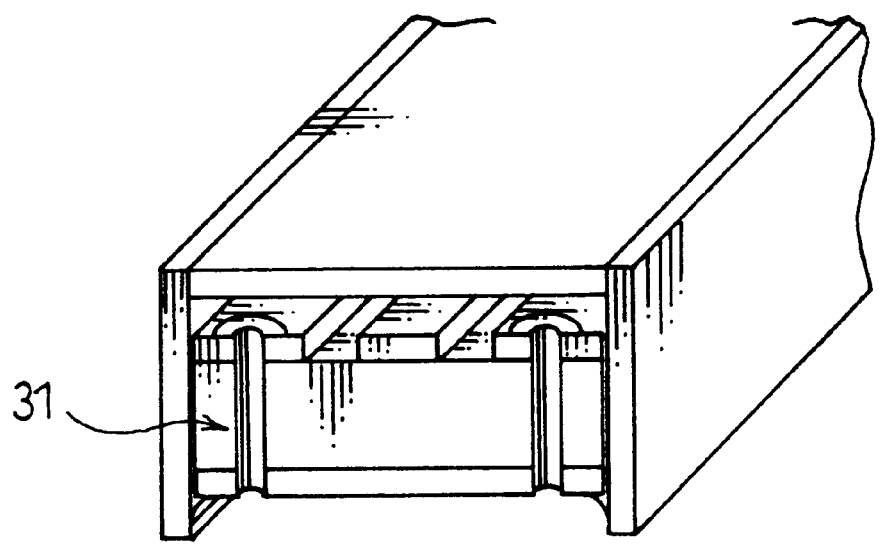
FIGS. 14(a) and 14(b) show a further example of a structure for an IF link section of the Up/Down tuner shown in FIG. 1, FIG. 14(a) being a perspective view and FIG. 14(b) a cross-sectional view.
Figure 14:
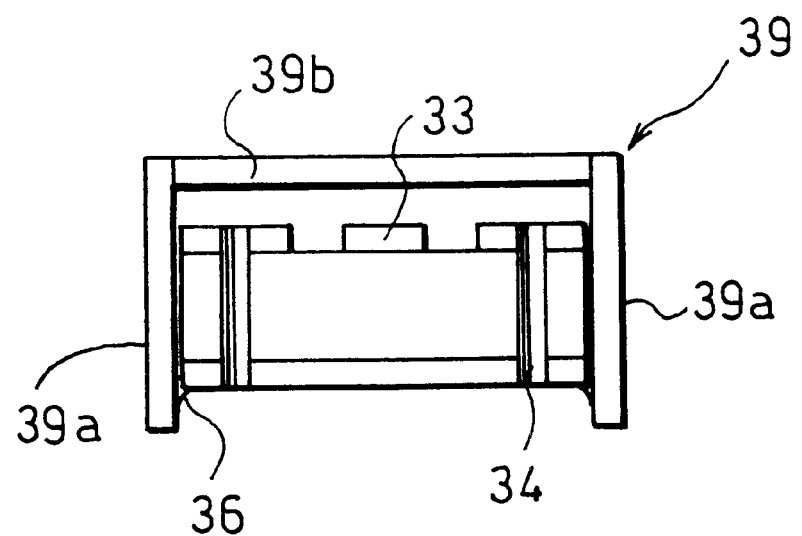

The up-converter section 1 is provided with a shield member 39a, which forms part of a shield section 39 (see FIG. 14(b)) of the IF link section 3. Further, the down-converter section 2 is provided with a shield member 39b, which forms another part of the shield section 39 of the IF link section 3.

Here, in the IF link section 3, as shown in FIGS. 14(a) and 14(b), the structure on the completed substrate 31 is substantially the same as in Example 1, but the top (front) and sides of the completed substrate 31 are shielded by the shield section 39, which is made up of the shield members 39a and 39b. Accordingly, since, in the present Example 3, unlike the foregoing Examples, the sides of the signal line 33 are shielded by the shield section 39, the through holes 34 need not be filled with a conductive material.

In cross-section, the shield section 39 is shaped like a rectangle open on one side, and, in the IF link section 3, as discussed above, surrounds the top (front) and sides of the completed substrate 31, thus shielding the signal line 33. Here, in order to prevent the shield member 39b, which forms the top of the shield section 39, from touching the signal line 33, the shield member 39b is provided at a sufficient distance from the signal line 33. The shield member 39a is electrically connected, by the solder 36, to the conductive surface on the back of the completed substrate 31.

Accordingly, in the IF link section 3 with the foregoing structure, the signal line 33 is surrounded and insulated on all sides by the conductive surface on the back of the completed substrate 31, the solder 36, and the shield section 39. Here, by grounding, for example, the conductive surface on the back of the completed substrate 31, the IF link section 3 can be given a coaxial shielding structure, in which the signal line 33 is surrounded on all sides by ground.

Giving the IF link section 3 a coaxial shielding structure in this way can greatly reduce entry into the tuner of external noise from the environment in which the tuner is placed.

EXAMPLE 4

First, the structure of the Up/Down tuner according to the present Example 4 will be explained.

Figure 15:
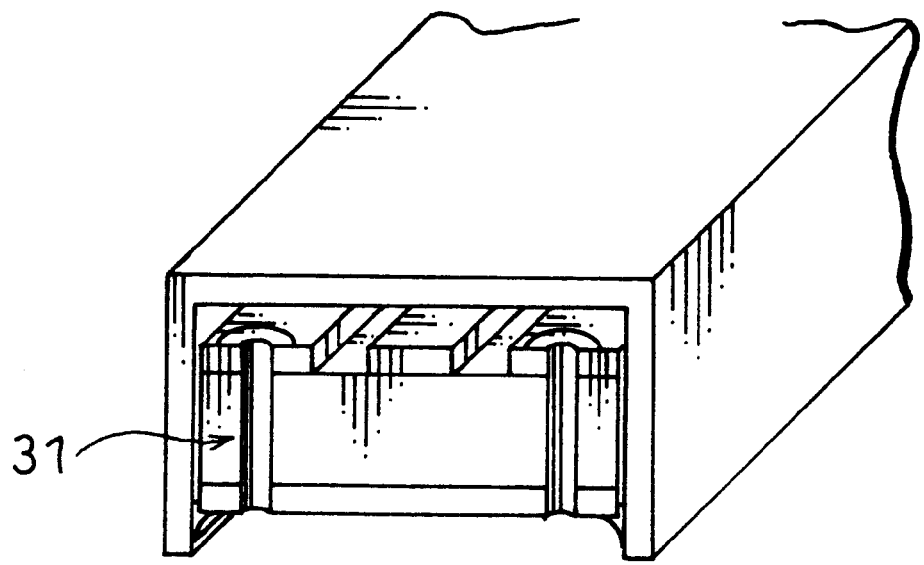
FIGS. 15(a) and 15(b) show a further example of a structure for an IF link section of the Up/Down tuner shown in FIG. 1, FIG. 15(a) being a perspective view and FIG. 15(b) a cross-sectional view.
Figure 15:
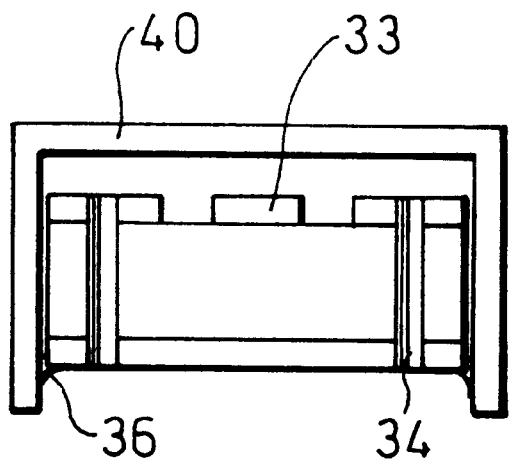

In the present Up/Down tuner, as shown in FIGS. 15(a) and 15(b), a shield member 40 forms part of the shield of the signal line 33 of the IF link section 3. The shield member 40 is not formed by part of the chassis of the up-converter section 1 or of the down-converter section 2, but is a separate member. In other words, the Up/Down tuner according to the present Example 4 is made up of the up-converter section 1 shown in FIGS. 4(a) through 4(e), combined with the down-converter section 2 shown in FIGS. 5(a) through 5(e).

Here, in the IF link section 3, the structure on the completed substrate 31 is the same as in Example 3. Further, as shown in FIGS. 15(a) and 15(b), the top (front) and sides of the completed substrate 31 are shielded by the shield member 40.

In cross-section, the shield section 40 is shaped like a rectangle open on one side, and, in the IF link section 3, as discussed above, surrounds the top (front) and sides of the completed substrate 31, thus shielding the signal line 33. Here, in order to prevent the upper part of the shield member 40 from touching the signal line 33, the shield member 40 is provided at a sufficient distance from the signal line 33. The shield member 40 is electrically connected, by the solder 36, to the conductive surface on the back of the completed substrate 31.

Accordingly, in the IF link section 3 with the foregoing structure, the signal line 33 is surrounded and insulated on all sides by the conductive surface on the back of the completed substrate 31, the solder 36, and the shield member 40. Here, by grounding, for example, the conductive surface on the back of the completed substrate 31, the IF link section 3 can be given a coaxial shielding structure, in which the signal line 33 is surrounded on all sides by ground.

Giving the IF link section 3 a coaxial shielding structure in this way can greatly reduce entry into the tuner of external noise from the environment in which the tuner is placed.

EXAMPLE 5

First, the structure of the Up/Down tuner according to the present Example 5 will be explained.

In each of the Up/Down tuners in Examples 1 through 4, a double-sided substrate was used in the IF link section 3, but in the Up/Down tuner in the present Example 5, a multi-layered substrate is used in the IF link section 3. In the present Example 5, as will be explained below, shielding the signal line 33 requires no further members, and the Up/Down tuner is made up of the up-converter section 1 shown in FIGS. 4(a) through 4(e), combined with the down-converter section 2 shown in FIGS. 5(a) through 5(e).

Figure 16:
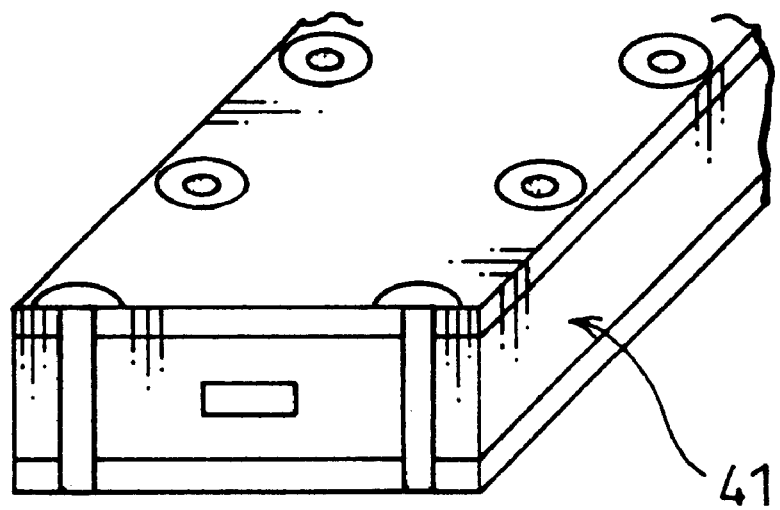
FIGS. 16(a) and 16(b) show a further example of a structure for an IF link section of the Up/Down tuner shown in FIG. 1, FIG. 16(a) being a perspective view and FIG. 16(b) a cross-sectional view.
Figure 16:
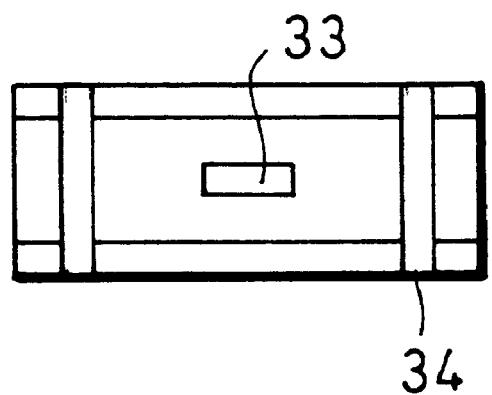
Figure 17:
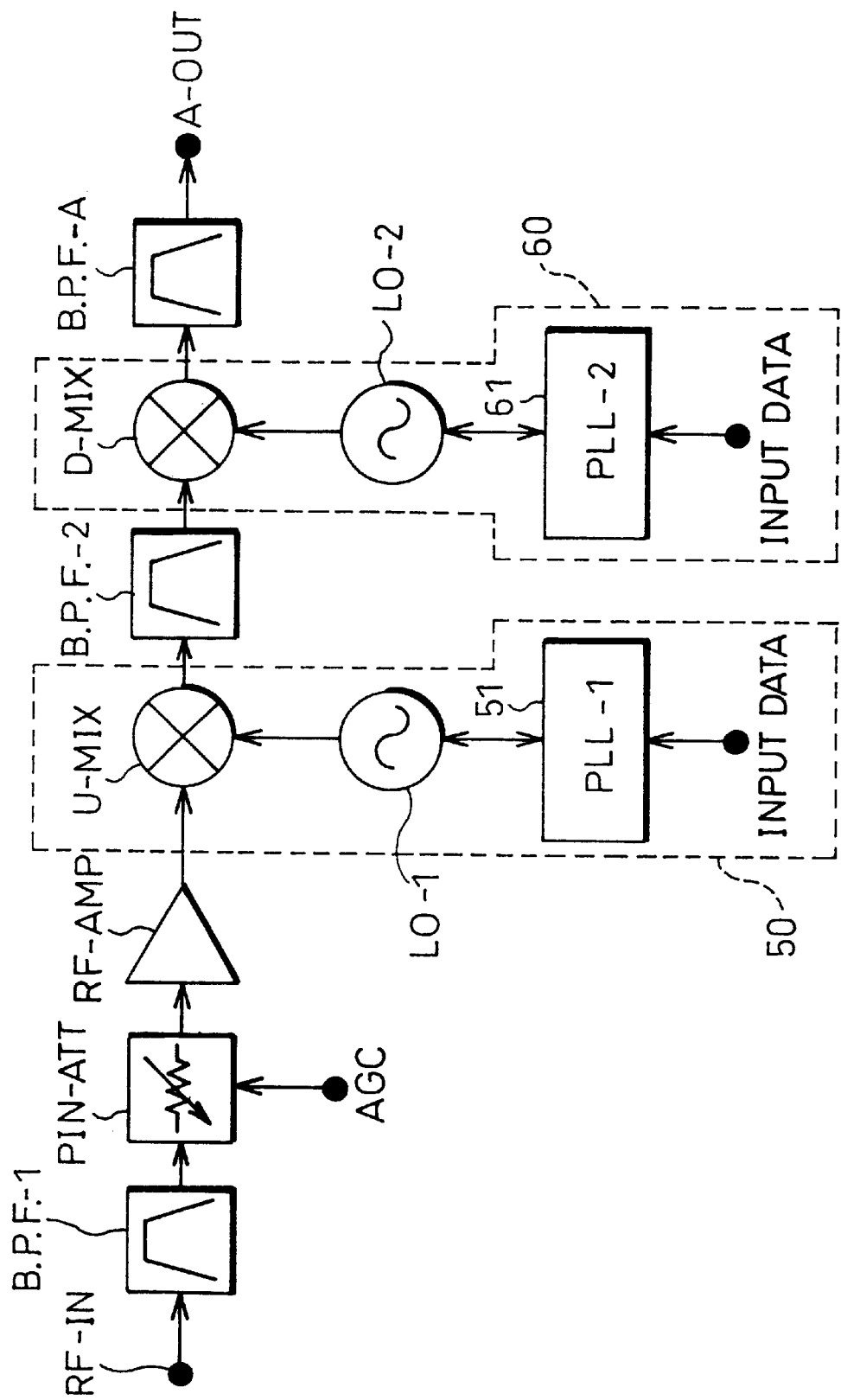
FIG. 17 is a block diagram showing the circuit structure of a conventional Up/Down tuner.
Figure 18:
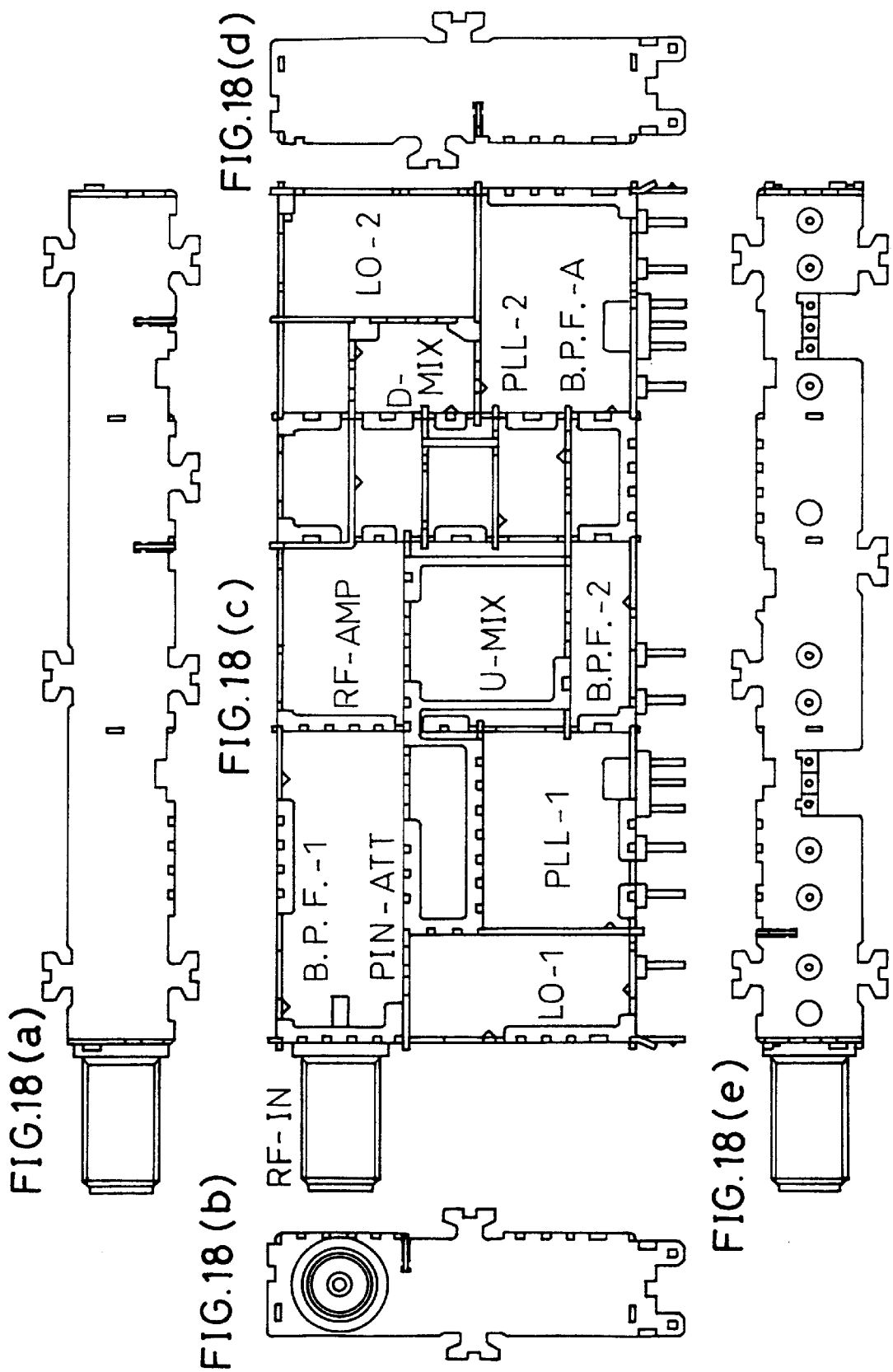
FIGS. 18(a) through 18(e) schematically show the structure of a conventional Up/Down tuner, FIG. 18(c) being a plan view, FIG. 18(e) a front view, FIG. 18(a) a rear view, and FIGS. 18(b) and 18(d) side views.
Figure 19:
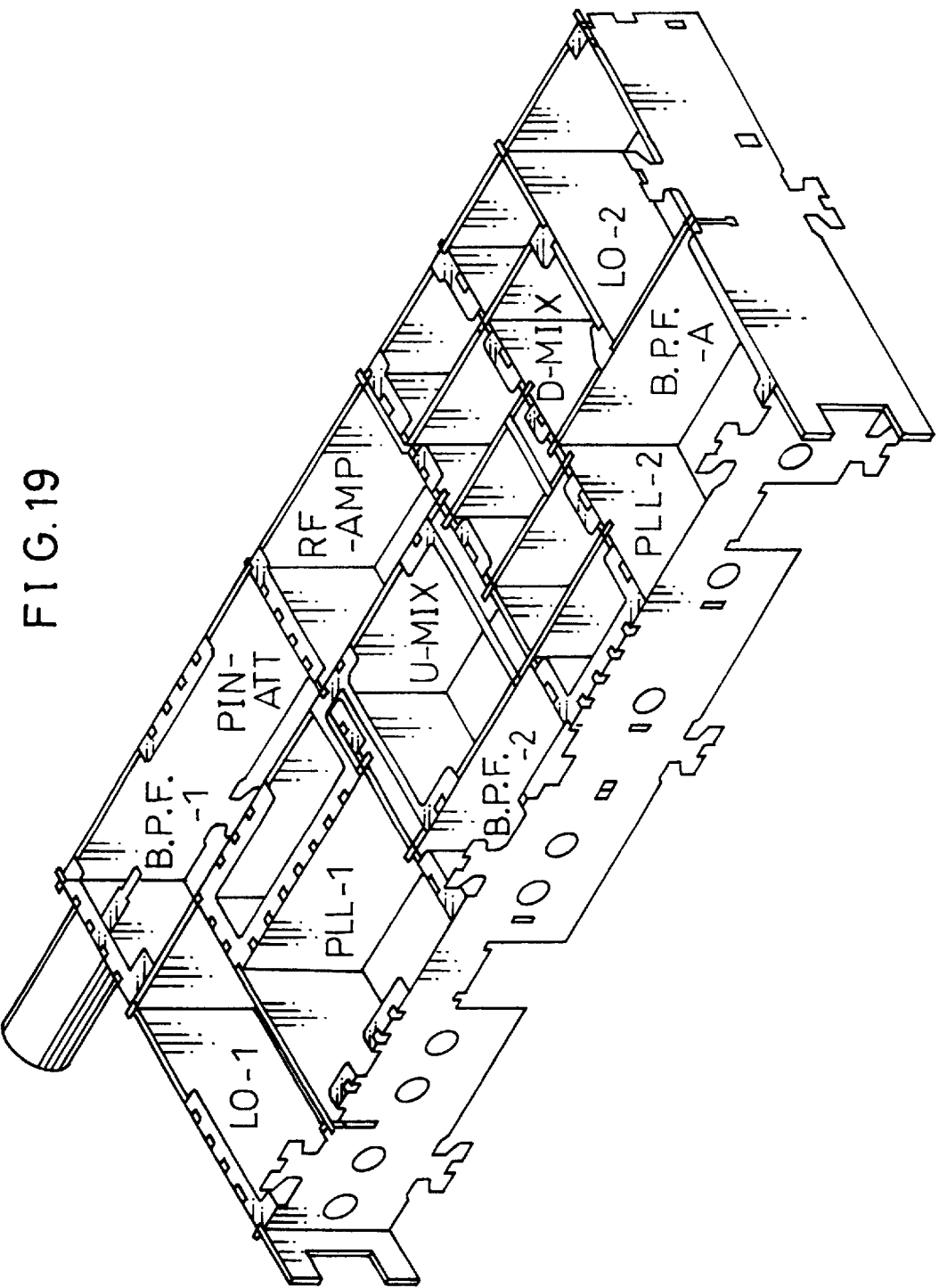
FIG. 19 is a perspective view schematically showing the structure of a conventional Up/Down tuner.

Here, in the IF link section 3, a completed substrate 41 is made up of a multi-layered substrate having at least three layers, in which, as shown in FIGS. 16(a) and 16(b), the signal line 33 is formed integrally with a middle layer, and uppermost and lowermost layers are used as layers for shielding the signal line 33.

The uppermost and lowermost layers of the completed substrate 41 are electrically connected by the, through holes 34 filled with a conductive material. Further, the through holes 34 shield the sides of the signal line 33.

Accordingly, in the IF link section 3 with the foregoing structure, the signal line 33 is surrounded and insulated on all sides by the conductive surfaces on the front and back of the completed substrate 41, and the through holes 34. Here, by grounding, for example, the conductive surface on the front or back of the completed substrate 41, the IF link section 3 can be given a coaxial shielding structure, in which the signal line 33 is surrounded on all sides by ground.

Giving the IF link section 3 a coaxial shielding structure in this way can greatly reduce entry into the tuner of external noise from the environment in which the tuner is placed.

As discussed above, the Up/Down tuner according to the present invention includes two or more frequency conversion sections (in the embodiment, the up-converter section 1 and the down-converter section 2) contained in separate respective chassis, and the respective chassis containing the respective frequency conversion sections are linked by the IF link section 3.

With this structure, since each frequency conversion section is contained in a different respective chassis, in comparison with a conventional Up/Down converter in which a plurality of frequency conversion sections are contained in a single chassis, a signal produced by a local oscillator circuit in one frequency conversion section is less likely to travel through the chassis and influence the other frequency conversion section.

Further, in the present Up/Down tuner, the signal transmitting section has a coaxial shielding structure, in which a grounded conductive material forms a shield surrounding a signal line which serves as the signal transmission path between the respective frequency conversion sections, and which is provided on one side of a double-sided substrate. Accordingly, unnecessary radiation, such as leakage of a signal from the local oscillator circuit, etc., of the frequency conversion section, as well as entry of external noise from the environment in which the tuner is placed, can be reduced. Further, in this case, since the conductive surface on the side of the double-sided substrate opposite the side on which is provided the signal line can be used as part of the shield, the shield structure of the IF link section 3 can be simplified. In other words, there is no need to provide a further shield member on the side of the double-sided substrate opposite the signal line. This contributes to reduction of the number of members and simplification of the manufacturing process.

Further, in the present Up/Down tuner, if the parts of the IF link section 3 other than the part shielded by the conductive surface on the side of the double-sided substrate opposite the signal line are shielded by part(s) of one or both of the respective chassis linked by the IF link section 3, there is no need to provide a separate shield member to shield the signal line. This contributes to reduction of the number of members. Further, it is easy to secure the shield, which contributes to simplification of the manufacturing process.

Further, in the present Up/Down tuner, if the signal line of the IF link section 3 is provided on an internal layer of a multi-layered substrate, and the signal line is shielded by surrounding it with grounded conductive material, uppermost and lowermost layers of the multi-layered substrate can be used as part of the shield.

With this structure, since the IF link section 3 has a coaxial shielding structure, in which the signal line is surrounded by grounded conductive material, unnecessary radiation, such as leakage of a signal from the local oscillator circuit, etc., of the frequency conversion section, as well as entry of external noise from the environment in which the tuner is placed, can be reduced.

Further, in this structure, the signal line is, provided on an internal layer of a multi-layered substrate, and the uppermost and lowermost layers of the multi-layered substrate are used as part of the shield of the signal line. Consequently, the shield structure of the IF link section 3 can be simplified. In other words, it is unnecessary to provide any further shield on the uppermost and lowermost layers of the multi-layered substrate 3, which contributes to reduction of the number of members and simplification of the manufacturing process.

The embodiments and concrete examples of implementation discussed in the foregoing detailed explanation of the present invention serve solely to illustrate the technical contents of the present invention, which should not be narrowly interpreted within the limits of such concrete examples, but rather may be applied in many variations without departing from the spirit of the present invention and the scope of the patent claims set forth below.

What is claimed is:

1. An Up/Down tuner comprising:

two or more frequency conversion sections contained in separate and detached respective chassis; and a signal transmitting device linking the respective chassis containing the respective frequency conversion sections, wherein at least one of the frequency conversion sections includes an up converter and at least one of the frequency conversion sections includes a down converter, wherein each of the frequency conversion sections includes an oscillator, and wherein each of the separate chassis include wall portions, with no wall surface of one chassis being in common with the wall surface of another chassis.

2. An Up/Down tuner, comprising:

two or more frequency conversion sections contained in separate and detached respective chassis; and a signal transmitting device linking the respective chassis containing the respective frequency conversion sections, said signal transmitting device including a coaxial shielding structure in which grounded conductive material forms a shield surrounding a signal line which serves as a signal transmission path between the respective frequency conversion sections, wherein said signal line is provided on one side of a double-sided substrate, and said shield is formed in part by a conductive surface on a side of said double-sided substrate opposite the side provided with said signal line, and wherein each of the separate chassis include wall portions, with no wall surface of one chassis being in common with the wall surface of another chassis.

3. The Up/Down tuner set forth in claim 2, wherein in said signal transmitting device:

said shield is formed in part by a flat conductive plate attached to an upper surface of the side of said double-sided substrate provided with said signal line.

4. The Up/Down tuner set forth in claim 3, wherein, in said signal transmitting device:

said conductive surface on the side of said double-sided substrate opposite the side provided with said signal line is electrically connected to said conductive plate attached to the upper surface of said double-sided substrate by through holes filled with conductive material.

5. The Up/Down tuner set forth in claim 2, wherein:

parts of said signal transmitting device other than a part shielded by said conductive surface on the side of said double-sided substrate opposite said signal line are shielded by parts of each respective chassis linked by said signal transmitting device.

6. The Up/Down tuner set forth in claim 2, wherein:

parts of said signal transmitting device other than a part shielded by said conductive surface on the side of said double-sided substrate opposite said signal line, are shielded by part of one of the respective chassis linked by said signal transmitting device.

7. The Up/Down tuner set forth in claim 2, wherein:

parts of said signal transmitting device other than a part shielded by said conductive surface on the side of said double-sided substrate opposite said signal line are shielded by a conductive member other than the respective chassis linked by said signal transmitting device.

8. The Up/Down tuner set forth in claim 1, wherein:

said signal transmitting device is formed by a terminal having a coaxial shielding structure.

9. The Up/Down tuner set forth in claim 1, wherein, in said signal transmitting device:

a signal line is provided on an internal layer of a multi-layered substrate, and a shield is formed in part by an uppermost layer and a lowermost layer of said multi-layered substrate.

10. The Up/Down tuner set forth in claim 9, wherein:

said uppermost and lowermost layers of said multi-layered substrate are electrically connected by through holes filled with conductive material.

* * * * *